United States Patent
Nakanishi et al.

(10) Patent No.: US 8,174,165 B2
(45) Date of Patent: May 8, 2012

(54) SURFACE ACOUSTIC WAVE DEVICE AND MANUFACTURING METHOD OF THE SAME SURFACE ACOUSTIC WAVE DEVICE

(75) Inventors: Hidekazu Nakanishi, Osaka (JP); Hiroyuki Nakamura, Osaka (JP); Yukio Iwasaki, Osaka (JP)

(73) Assignee: Panasonic Corporation, Osaka (JP)

( * ) Notice: Subject to any disclaimer, the term of this patent is extended or adjusted under 35 U.S.C. 154(b) by 303 days.

(21) Appl. No.: 12/720,778

(22) Filed: Mar. 10, 2010

(65) Prior Publication Data

US 2010/0231089 A1   Sep. 16, 2010

(30) Foreign Application Priority Data

Mar. 11, 2009   (JP) .................... 2009-057687

(51) Int. Cl.
*H03H 9/25* (2006.01)
*H01L 41/22* (2006.01)

(52) U.S. Cl. ............... 310/313 B; 310/313 D; 310/340; 29/25.35

(58) Field of Classification Search .............. 310/313 A, 310/313 B, 313 D, 313 R, 340; 29/25.35
See application file for complete search history.

(56) References Cited

U.S. PATENT DOCUMENTS

| | | | | |
|---|---|---|---|---|
| 7,548,364 | B2 * | 6/2009 | Jennings | 359/285 |
| 2003/0090173 | A1 * | 5/2003 | Sakaguchi et al. | 310/365 |

* cited by examiner

*Primary Examiner* — Thomas M Dougherty
(74) *Attorney, Agent, or Firm* — Wenderoth, Lind & Ponack, L.L.P.

(57) ABSTRACT

A surface acoustic wave device includes a piezoelectric element, an IDT electrode formed on the piezoelectric element for exciting a principal wave, a reflection film formed on the piezoelectric element having a higher reflectivity than the reflectivity of the piezoelectric element in a visible light wavelength region, and a light permeable dielectric layer formed on the piezoelectric element, at least a part of the IDT electrode, and the reflection film. Accordingly, when measuring the film thickness of the light permeable dielectric layer by light interference method, the reflected light from the reflection film having a higher reflectivity than the reflectivity of the piezoelectric element in a visible light wavelength region can be utilized, so that the film thickness can be measured more accurately.

10 Claims, 5 Drawing Sheets

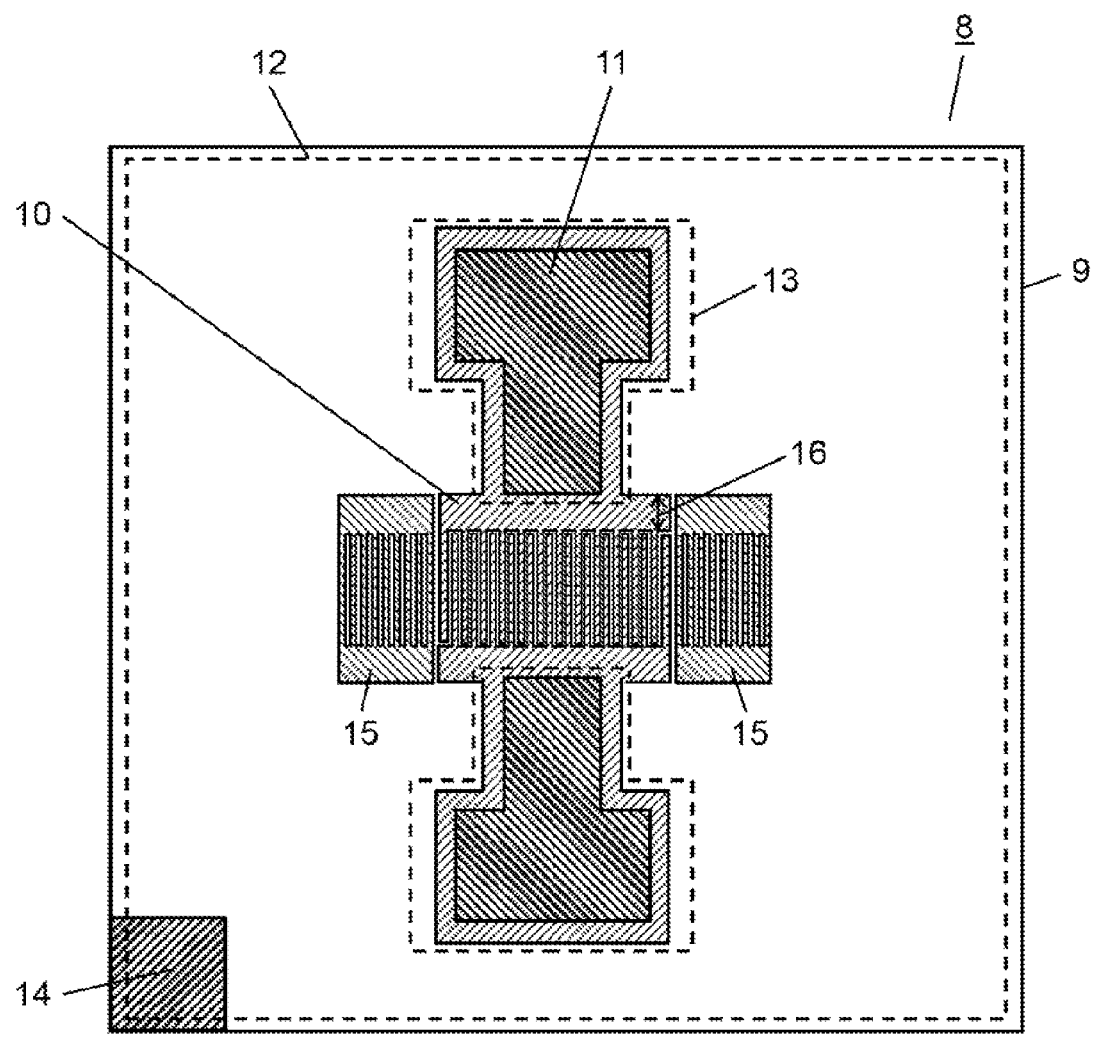

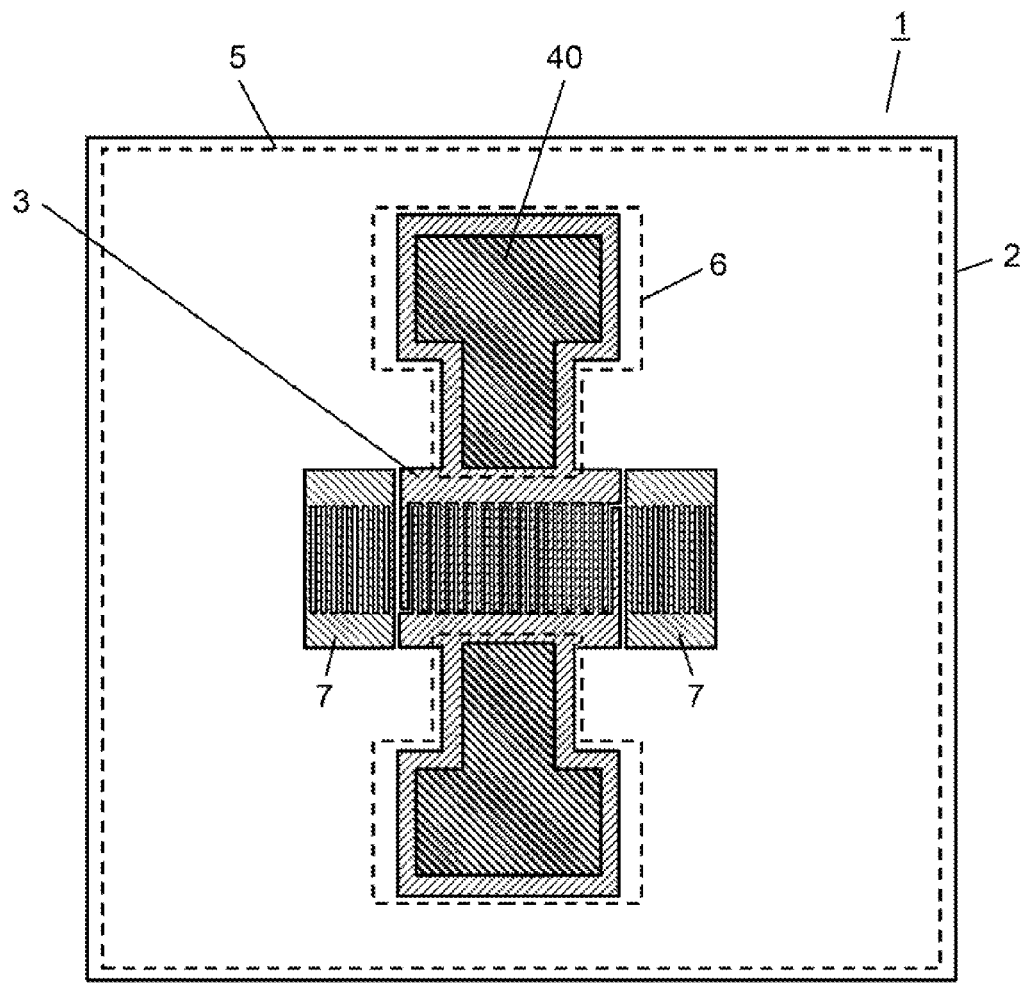

SURFACE ACOUSTIC WAVE DEVICE AND MANUFACTURING METHOD OF THE SAME SURFACE ACOUSTIC WAVE DEVICE

TECHNICAL FIELD

The present invention relates to a surface acoustic wave device, and a manufacturing method of the same surface acoustic wave device.

BACKGROUND ART

A conventional surface acoustic wave device is explained below by referring to the drawing. FIG. 6 is a top view of the conventional surface acoustic wave device.

In FIG. 6, surface acoustic wave device 1 includes piezoelectric element 2 made of, for example, lithium niobate, lithium tantalate, or the like, and inter-digital transducer (hereinafter called IDT) electrode 3 made of copper or other metal formed on this piezoelectric element 2. Further, on piezoelectric element 2, other components are mounted, that is, grating reflectors 7 provided at both ends of IDT electrode 3, pad electrode 40 made of aluminum or other metal electrically connected to IDT electrode 3, and light permeable dielectric layer 5 made of silicon oxide or the like formed on piezoelectric element 2 for covering IDT electrode 3. This light permeable dielectric layer 5 has opening 6 to be exposed from light permeable dielectric layer 5 in part or in whole of the top of pad electrode 40 so as to be conductive between the outside of the device and pad electrode 40.

In a manufacturing process of such conventional surface acoustic wave device 1, after forming a film of light permeable dielectric layer 5, by comparing the polarized state of the incident light and the polarized state of the reflected light reflected from piezoelectric element 2 by using an ellipsometer or the like, the film thickness of light permeable dielectric layer 5 is measured.

However, in such measurement of the film thickness, the light reflectivity of piezoelectric element 2 in a visible light wavelength region is not sufficiently high, or the measured value is very sensitive to roughness of the substrate surface, and it was difficult to measure the film thickness accurately. As a result, surface acoustic wave devices out of the frequency standard may be produced and the yield is poor, and the productivity is lowered. These problems are caused because of large change in frequency characteristic of the surface acoustic wave device depending on the film thickness of light permeable dielectric layer 5.

The present invention is hence devised to enhance the productivity of surface acoustic wave devices by improving the accuracy of film thickness measurement of the light permeable dielectric layer.

SUMMARY OF THE INVENTION

A surface acoustic wave device includes a piezoelectric element, an IDT electrode formed on the piezoelectric element, a reflection film formed on the piezoelectric element having a higher reflectivity than the reflectivity of the piezoelectric element in a visible light wavelength region, and a light permeable dielectric layer formed on the piezoelectric element, at least a part of the IDT electrode, and the reflection film.

In this configuration, when the film thickness of the light permeable dielectric layer after forming of film is measured by a light interference method, it is possible to use a reflected light from the reflection film having a higher reflectivity than the reflectivity of the piezoelectric element in a visible light wavelength region. Therefore, the film thickness can be measured more accurately, and it is possible to prevent formation of surface acoustic wave devices out of the frequency standard, and lowering of the yield can be suppressed. That is, the productivity of surface acoustic wave devices can be enhanced.

BRIEF DESCRIPTION OF THE DRAWINGS

FIG. 5 is a top view of another surface acoustic wave device in the preferred embodiment of the present invention.

FIG. 6 is a top view of a conventional surface acoustic wave device.

DETAILED DESCRIPTION OF PREFERRED EMBODIMENTS

Figure 1:
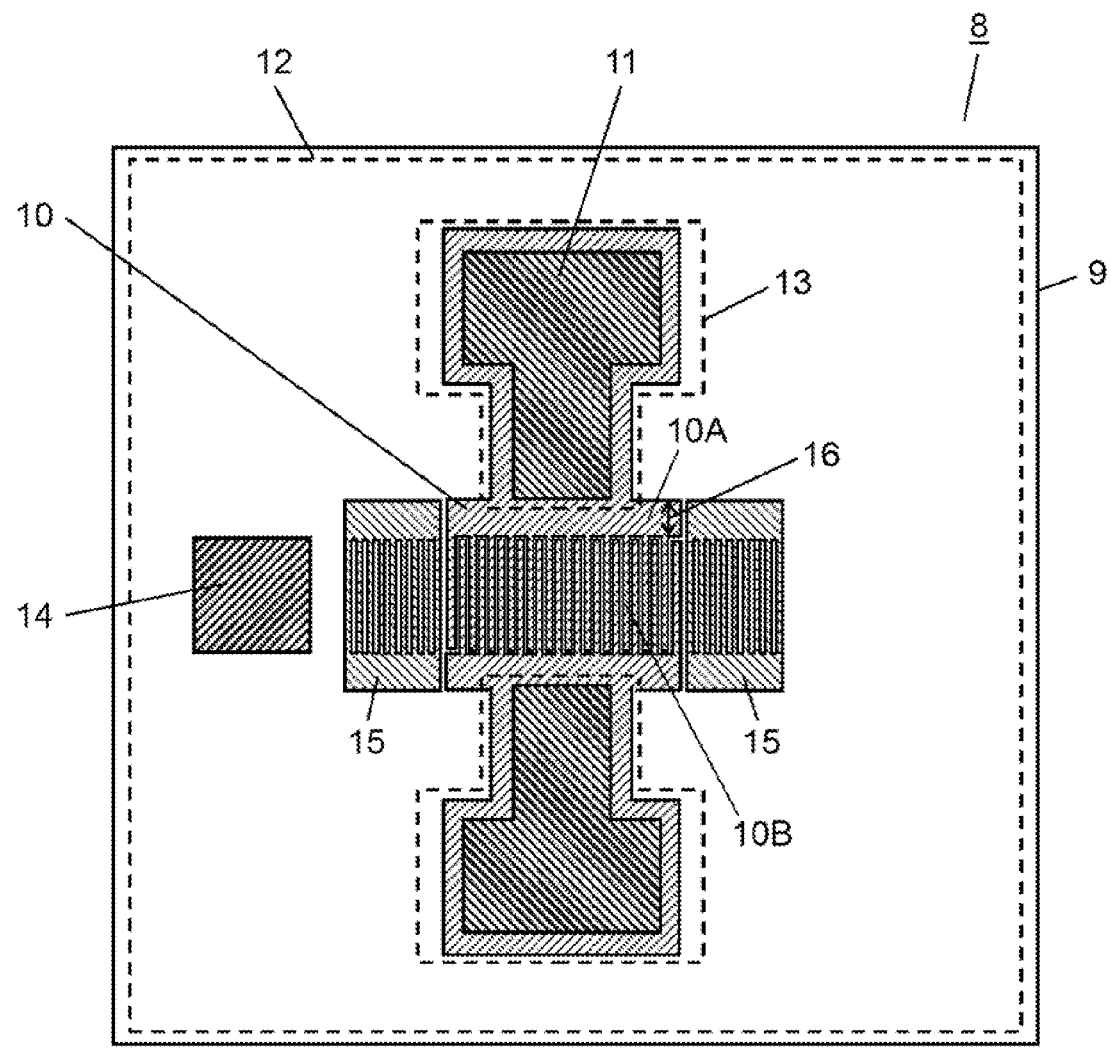
FIG. 1 is a top view of a surface acoustic wave device in a preferred embodiment of the present invention.

A preferred embodiment of the present invention is described below by reference to the accompanying drawings. FIG. 1 is a top view of a surface acoustic wave device in the preferred embodiment of the present invention.

In FIG. 1, surface acoustic wave device 8 includes piezoelectric element 9, IDT electrode 10 formed on plane 9A of this piezoelectric element 9 for exciting a principal wave such as share horizontal (SH) wave, and grating reflector 15 formed on plane 9A of piezoelectric element 9 at both ends of IDT electrode 10. It further includes pad electrode 11 formed on plane 9A of piezoelectric element 9 and connected electrically to IDT electrode 10 for input and output of electric signals, and light permeable dielectric layer 12 formed on plane 9A of piezoelectric element 9 for covering IDT electrode 10. This light permeable dielectric layer 12 has opening part 13 exposed from light permeable dielectric layer 12 in part or whole of the top of pad electrode 11 to be conductive between the outside of the device and pad electrode 11.

Piezoelectric element 9 is a medium made of, for example, lithium niobate system, lithium tantalate system, or potassium niobate system.

IDT electrode 10, grating reflector 15, and pad electrode 11 are composed of, for example, a single metal of at least one kind selected from aluminum, copper, silver, gold, titanium, tungsten, platinum, chromium, and molybdenum, or an alloy mainly composed of these compounds, or these metals may be formed in a laminated structure.

Light permeable dielectric layer 12 is made of, for example, silicon oxide, or may be made of any other medium as far as having a frequency-temperature characteristic reverse to piezoelectric element 9. As a result, the frequency-temperature characteristic may be enhanced. Moreover, light permeable dielectric layer 12 may be formed in a laminated structure consisting of a first medium, and a second medium for propagating a transverse wave faster than the speed of a transverse wave propagating through the first medium, sequentially formed on piezoelectric element 9. For example, the first medium is silicon oxide, and the second medium is at least one of silicon nitride, aluminum nitride, aluminum oxide, and silicone.

The film thickness of this light permeable dielectric layer 12 is desired to be 0.8 times or more of wavelength $\lambda$ of the principal wave of SH wave. Hence, the principal wave may be closed within surface acoustic wave device 8. Preferably, when the film thickness of light permeable dielectric layer 12 is more than wavelength $\lambda$ of the principal wave of SH wave, the principal wave may be closed almost completely within surface acoustic wave device 8.

Furthermore, surface acoustic wave device 8 has reflection film 14 for measurement of film thickness, formed on plane 9A of piezoelectric element 9 so as to be covered with light permeable dielectric layer 12, having a higher reflectivity than the reflectivity of the piezoelectric element in a visible light wavelength region.

This reflection film 14 is made of same composition as, for example, IDT electrode 10, composed of a single metal of at least one kind selected from aluminum, copper, silver, gold, titanium, tungsten, platinum, chromium, and molybdenum, or an alloy mainly composed of these compounds, or these metals may be formed in a laminated structure.

In this configuration, after forming of light permeable dielectric layer 12, in the manufacturing process of surface acoustic wave device 8, when measuring the film thickness of light permeable dielectric layer 12 by a film thickness measuring method or the like by light interference method, it is allowed to use the reflected light from reflection film 14 having a higher reflectivity than the reflectivity of piezoelectric element 9 in a visible light wavelength region. Therefore, the film thickness of light permeable dielectric layer 12 can be measured more accurately, and it is possible to prevent formation of surface acoustic wave devices 8 out of the frequency standard, and lowering of the yield can be suppressed. That is, the productivity of surface acoustic wave device 8 can be enhanced.

The manufacturing process of surface acoustic wave device 8 in the preferred embodiment of the present invention is described below.

Figure 2A:
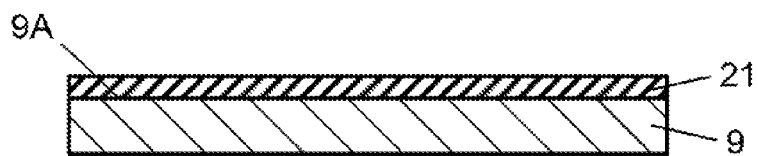
FIG. 2A to FIG. 2E are sectional views showing a manufacturing process of the surface acoustic wave device in the preferred embodiment of the present invention.
Figure 2B:
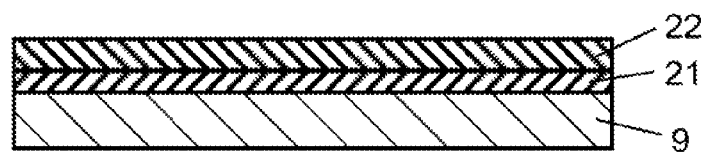
Figure 2C:
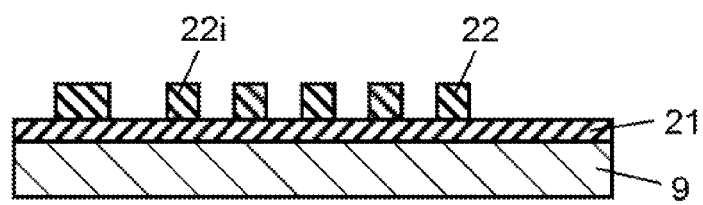
Figure 2D:
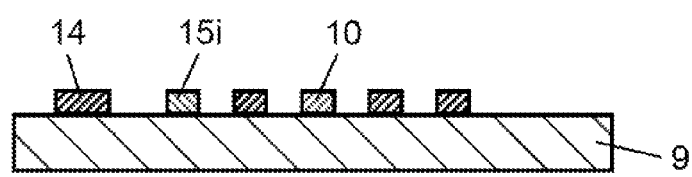
Figure 2E:
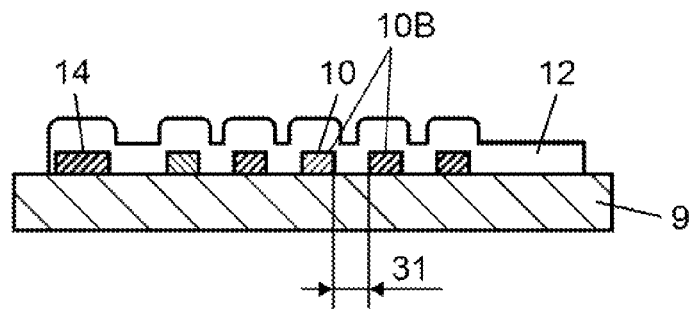

FIG. 2A to FIG. 2E are sectional views showing the manufacturing process of surface acoustic wave device 8 in the preferred embodiment of the present invention. First, as shown in FIG. 2A, electrode film 21 is formed by evaporating, sputtering or other method on plane 9A of piezoelectric element 9 composed of a medium such as lithium niobate system or the like. Then, as shown in FIG. 2B, resist film 22 is formed on the top of electrode film 21. Next, as shown in FIG. 2C, resist film 22 is processed into a desired shape by using a technology of photolithography. Further, as shown in FIG. 2D, by a technology of dry etching, electrode film 21 is processed into a desired shape of IDT electrode 10, grating reflector 15, and reflection film 14, and then resist film 22 is removed. Herein, pad electrode 11 for signal input and output is formed separately and similarly on plane 9A of piezoelectric element 11 so as to be connected electrically to IDT electrode 10. Next, as shown in FIG. 2E, light permeable dielectric layer 12 made of $SiO_2$ or other material is formed by evaporating, sputtering or other method so as to cover IDT electrode 10, reflection film 14 and others.

Afterwards, on the surface of light permeable dielectric layer 12, a resist film is formed, and the resist film is processed into a desired shape by exposing and developing technique or the like, and opening part 13 is provided in light permeable dielectric layer 12 on the top of pad electrode 11 by a technique of dry etching or the like, and thereby the resist film is removed.

Consequently, an incident light is entered into reflection film 14, and by using the reflected light from reflection film 14, the film thickness of light permeable dielectric layer 12 is measured.

Figure 3:
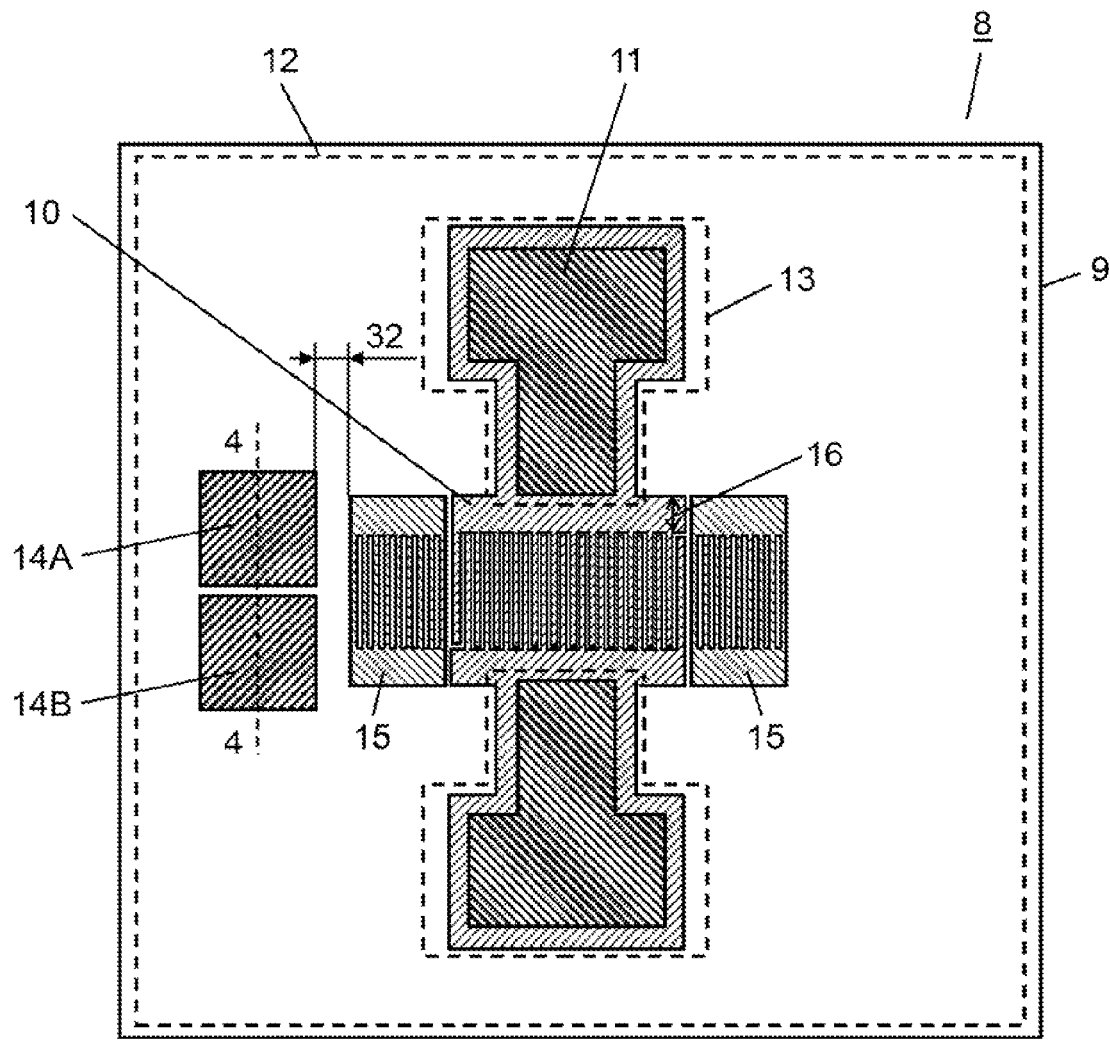
FIG. 3 is a top view of other surface acoustic wave device in the preferred embodiment of the present invention.
Figure 4:
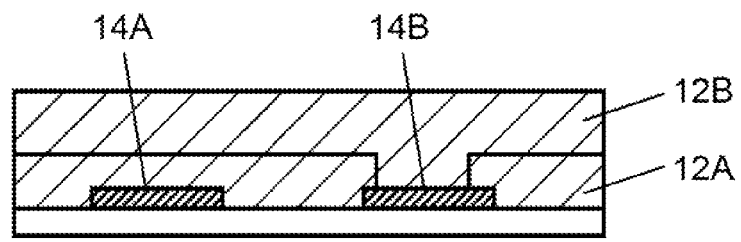
FIG. 4 is a sectional view along line 4-4 of the surface acoustic wave device in FIG. 3.

FIG. 3 is a top view of other surface acoustic wave device in the preferred embodiment of the present invention. FIG. 4 is a sectional view along line 4-4 of the surface acoustic wave device in FIG. 3.

As shown in FIG. 4, light permeable dielectric layer 12 is composed of two medium layers 12A, 12B made of different medium materials. That is, as shown in FIG. 3, reflection film 14A and reflection film 14B are formed, medium layers 12A, 12B are formed on one reflection film 14A, and only 12B of medium layers 12A, 12B is formed on other reflection film 14B. Thus, the film thickness of medium layer 12B can be measured, and when forming medium layer 12A, the film thickness of medium layer 12A can be measured, and when forming medium layer 12B, the film thickness of medium layer 12B can be measured independently. When light permeable dielectric layer 12 includes three or more medium layers, by forming reflection films 14A on plane 9A of piezoelectric element 9 in the same number of or more than the number of layers of the medium layers, similar effects can be obtained. Meanwhile, a similar configuration may be realized by forming an opening part on the top of reflection film 14B when forming opening part 13 in medium layer 12A on the top of pad electrode 11.

Finally, as a result of measurement of film thickness, when the film thickness of light permeable dielectric layer 12 is within the standard, it is divided into individual dice by dicing, and surface acoustic wave devices 8 are manufactured.

As explained above, moreover, when forming IDT electrode 10, it is preferred to form reflection film 14 at the same time, by using a same material as that of IDT electrode 10. As a result, an extra process for forming the reflection film can be omitted, and the manufacturing process can be simplified.

The material for composing the uppermost layer of reflection film 14 may be made of a material having a higher reflectivity in a visible light wavelength region than that of the material for composing the uppermost layer of IDT electrode 10. In this case, reflection film 14 is formed separately from the forming process of IDT electrode 10.

Accordingly, after forming light permeable dielectric layer 12, when measuring the film thickness of light permeable dielectric layer 12 by a film thickness measuring method such as light interference method, the reflected polarized light from reflection film 14 having a higher reflectivity in a visible light wavelength region than that IDT electrode 10 can be used. As a result, the film thickness of light permeable dielectric layer 12 can be measured more accurately.

Preferably, the minimum width of reflection film 14 should be larger than width 16 of bus bar 10A in a perpendicular direction to a principal wave propagation direction in the IDT electrode. As a result, when measuring the film thickness of light permeable dielectric layer 12 by a film thickness measuring method such as light interference method, the incident light can be easily entered into reflection film 14. Herein, the bus bar is a common electrode linking a plurality of comb teeth in the IDT electrode.

More specifically, the minimum width of reflection film 14 is preferred to be 5 µm or more and the maximum width of reflection film 14 is preferred to be 300 µm or less. When the minimum width of reflection film 14 is 5 µm or more, when measuring the film thickness of light permeable dielectric layer 12 by a film thickness measuring method such as light interference method, the incident light can be easily entered into reflection film 14. When the maximum width of reflection film 14 is 300 µm or less, surface acoustic wave device 1 is prevented from becoming larger than the size without reflection film 14.

The shape of reflection film 14 is preferred to be rectangular for measuring precise position and minimizing the size of surface acoustic wave device 8. More preferably, the length of the side of rectangular reflection film 14 is to be 50 µm or more and 150 µm or less.

Further, when surface acoustic wave device 8 has grating reflector 15 disposed at both sides of IDT electrode 10 along the propagation direction of principal wave in the IDT electrode, distance 32 (FIG. 3) from reflection film 14 to the outermost end of grating reflector 15 is preferred to be within two times of interval 31 (FIG. 2E) of adjacent comb tooth 10B and comb tooth 10B in IDT electrode 10. As a result, grating reflector 15 is formed appropriately, and manufacturing failure of surface acoustic wave device 8 can be suppressed.

The reason is explained below.

In FIG. 2B, an exposure light from a light source is emitted to resist film 22 by way of a mask, and is developed and processed, and hence, as shown in FIG. 2C, resist film 22 is left over only in an unexposed area. Herein, resist film 22i for forming comb 15i of the grating reflector at the outermost end is not formed properly, and comb 15i of the grating reflector at the outermost end may not be formed properly. This is because the aperture ratio of the mask of the upper part between comb 15i of the grating reflector at the outermost end and reflection film 14 is larger than the aperture ratio of the mask of the upper part of IDT electrode 10, and an excessive exposure is supplied to resist film 22 for forming comb 15i of the grating reflector at the outermost end. As a result, grating reflector 15 is not formed properly, and manufacturing failure of surface acoustic wave device 8 is caused.

Accordingly, reflection film 14 is formed by leaving an interval of more than two times of interval 31 between tooth and tooth of a plurality of combs in IDT electrode 10, from the outermost end of grating reflector 15. As a result, the aperture ratio of the mask of the upper part between comb 15i of the grating reflector at the outermost end and reflection film 14 is decreased, and grating reflector 15 at the outermost end can be formed properly.

FIG. 5 is a top view of other surface acoustic wave device in the preferred embodiment of the present invention. As shown in the drawing, reflection film 14 is formed at an end part on plane 9A of piezoelectric element 9, preferably at a corner on plane 9A of piezoelectric element 9, in particular. As a result, when measuring the film thickness of light permeable dielectric layer 12, reflection film 14 of a wide area before dividing into individual surface acoustic wave devices 8 by dicing can be used as a reflection plane. That is, when measuring the film thickness of light permeable dielectric layer 12 by a film thickness measuring method such as light interference method, the incident light can be easily entered into reflection film 14.

Moreover, reflection film 14 is not connected electrically to IDT electrode 10, that is, it is preferred to be insulated. Especially on plane 9A of piezoelectric element 9, reflection film 14 is preferred not to be connected electrically to IDT electrode 10. As a result, the characteristic deterioration of surface acoustic wave device 8 by being connected reflection film 14 can be suppressed.

Surface acoustic wave device 8 of the preferred embodiment of the present invention may be applied to a resonator, or may be applied to a ladder type or double mode SAW (DMS) filter, or other filters. Further, surface acoustic wave device 8 may be applied to this filter, a semiconductor integrated circuit device connected to the filter, or an electronic appliance having a speaker or other reproducing unit connected to the semiconductor integrated circuit device.

The invention claimed is:

1. A surface acoustic wave device comprising:
   a piezoelectric element having a plane;
   an IDT electrode formed on the plane of the piezoelectric element, for exciting a principal wave;
   a first reflection film formed on the plane of the piezoelectric element, having a higher reflectivity than the reflectivity of the piezoelectric element in a visible light wavelength region; and
   a light permeable dielectric layer formed on the piezoelectric element, on at least a part of the IDT electrode, and on the reflection film,
   wherein the minimum width of the first reflection film is larger than the width in a perpendicular direction to a propagation direction of the principal wave of a bus bar in the IDT electrode.

2. The surface acoustic wave device according to claim 1, wherein the minimum width of the first reflection film is 5 µm or more to 300 µm or less.

3. The surface acoustic wave device according to claim 1, further comprising:
   a second reflection film having a higher reflectivity than the reflectivity of the piezoelectric element,
   wherein the first and the second reflection films are formed at a plurality of positions on the plane of the piezoelectric element, and the light permeable dielectric layer formed on the first and the second reflection films are composed of a plurality of medium layers.

4. The surface acoustic wave device according to claim 1, wherein the reflection film and the IDT electrode are made of a same material.

5. The surface acoustic wave device according to claim 1, wherein a material for composing the reflection film is higher in reflectivity in a visible light wavelength region than a material for composing the IDT electrode.

6. The surface acoustic wave device according to claim 1, further comprising:
   a plurality of grating reflectors disposed at both sides of the IDT electrode along a propagation direction of the principal wave in the IDT electrode, on the plane of the piezoelectric element,
   wherein the interval between the reflection film and the grating reflector is within two times of the interval of a tooth and a tooth of a plurality of adjacent combs in the IDT electrode.

7. The surface acoustic wave device according to claim 1, wherein the reflection film is formed at an end part on the plane of the piezoelectric element.

8. The surface acoustic wave device according to claim 1, wherein the reflection film is electrically insulated from the IDT electrode.

9. A manufacturing method of a surface acoustic wave device comprising:
   a step of forming an IDT electrode on a piezoelectric element;
   a step of forming a reflection film having a higher reflectivity than the piezoelectric element in a visible light wavelength region, and having a minimum width larger than a width of a bus bar on the IDT electrode, on the piezoelectric element;
   a step of forming a light permeable dielectric layer so as to cover at least a part of the IDT electrode, the piezoelectric element, and the reflection film; and
   a step of measuring the film thickness of the formed light permeable dielectric layer, by a light interference method by making use of a reflected polarized light from the reflection film.

10. The manufacturing method of the surface acoustic wave device according to claim 9, wherein the step of forming the IDT electrode and the step of forming the reflection film are carried out at the same time.

* * * * *